(12) United States Patent
Kato et al.

(10) Patent No.: US 6,482,679 B1
(45) Date of Patent: Nov. 19, 2002

(54) ELECTRONIC COMPONENT WITH SHIELD CASE AND METHOD FOR MANUFACTURING THE SAME

(75) Inventors: Tatsuya Kato, Komatsu (JP); Yasuo Yokoyama, Ishikawa-ken (JP); Kazuhiko Kitade, Kaga (JP); Ryugaku Takamori, Komatsu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/723,211

(22) Filed: Nov. 27, 2000

(30) Foreign Application Priority Data

Nov. 26, 1999 (JP) .......................................... 11-335751

(51) Int. Cl.[7] .............................................. H01L 21/44
(52) U.S. Cl. ...................................... 438/121; 438/612
(58) Field of Search ................................. 438/106, 612, 438/615, 9, 121

(56) References Cited

U.S. PATENT DOCUMENTS 5,911,356 A * 6/1999 Tsuruskai .................... 228/136
5,986,506 A * 11/1999 Oga ............................. 330/286
6,025,998 A * 2/2000 Kitade et al. ................ 361/800
6,079,099 A * 6/2000 Uchida et al. ................. 29/837

* cited by examiner

Primary Examiner—John F. Niebling
Assistant Examiner—Christopher Lattin
(74) Attorney, Agent, or Firm—Ostrolenk, Faber, Gerb & Soffen, LLP

(57) ABSTRACT

The present invention provides a method for manufacturing a highly reliable electronic component in which the shield case is securely fixed to a substrate without requiring a step for filling a solder paste in engaging holes, and a highly reliable electronic component with a shield case manufactured by the method, wherein engaging pins of the shield case are inserted into the engaging holes of the mother substrate, reflow soldering is applied when the solder paste is coated on the circumference of the engaging holes as well as on the area including the circumference of the engaging hole and at least a part of the engaging hole at the reversed face (back face) of the component mounting face covered with the shield case of the mother substrate, and mother substrate is divided into individual electronic component with the shield case after soldering the engaging pins of the shield case to the case fixing electrodes disposed on the circumference face of the engaging holes.

20 Claims, 17 Drawing Sheets

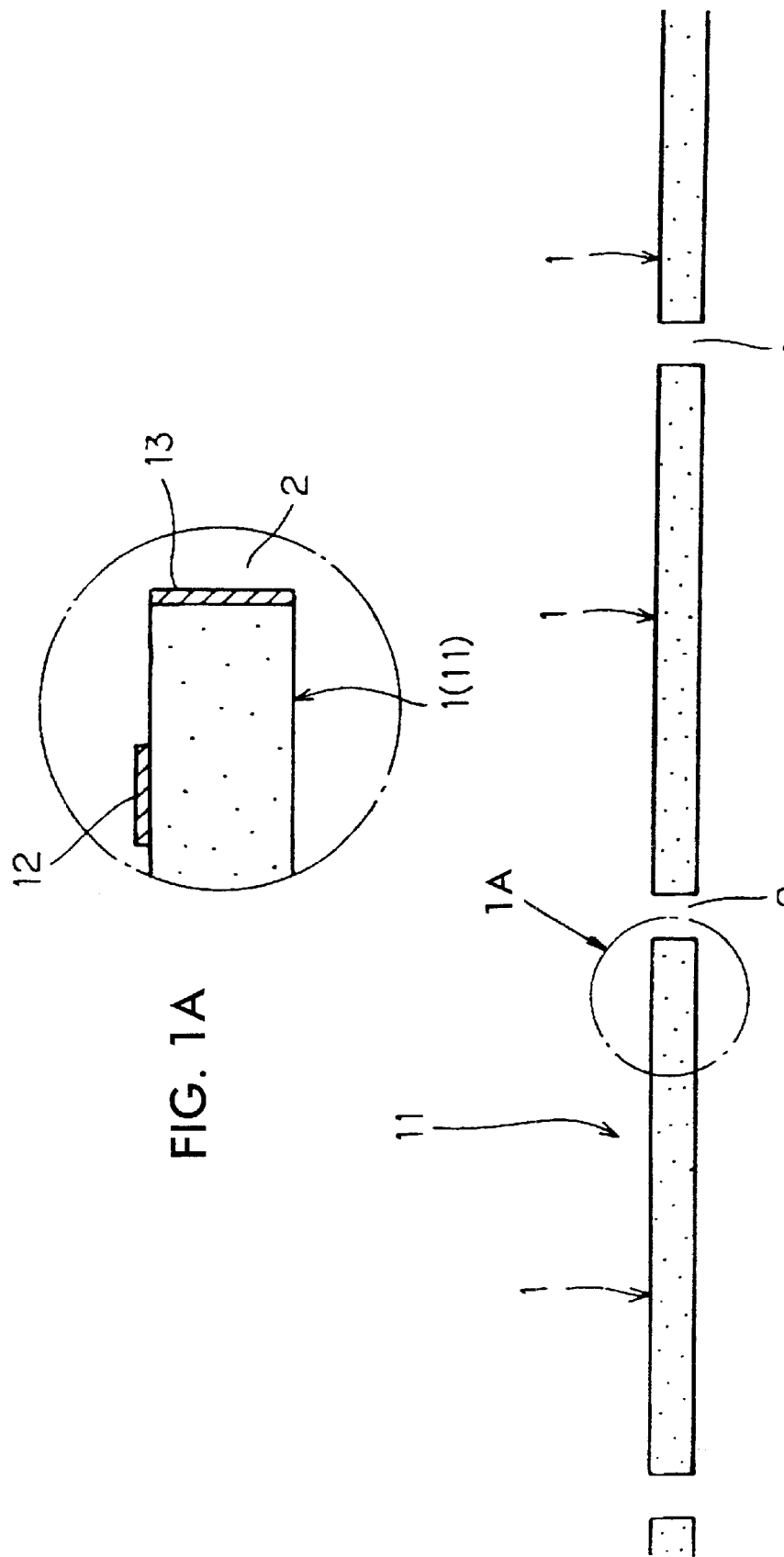

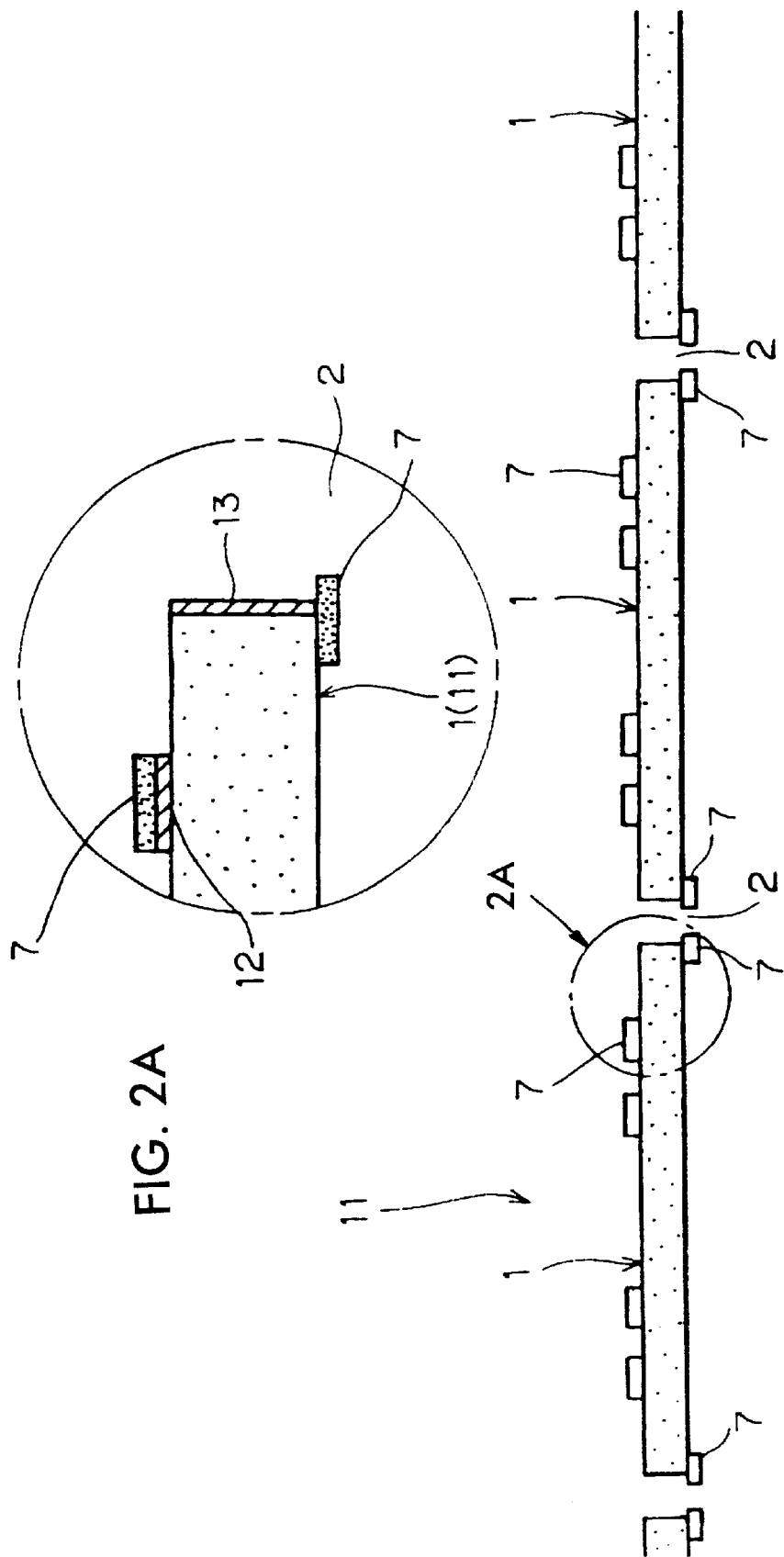

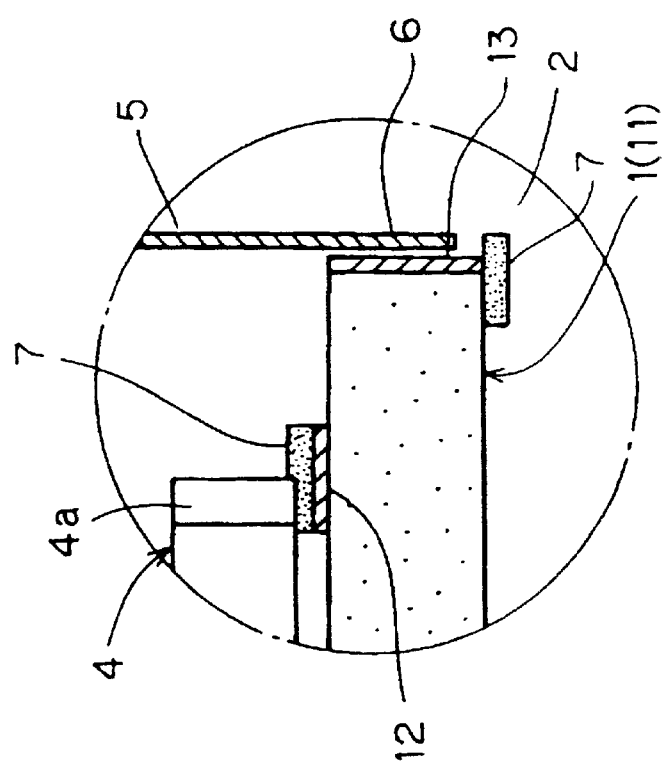
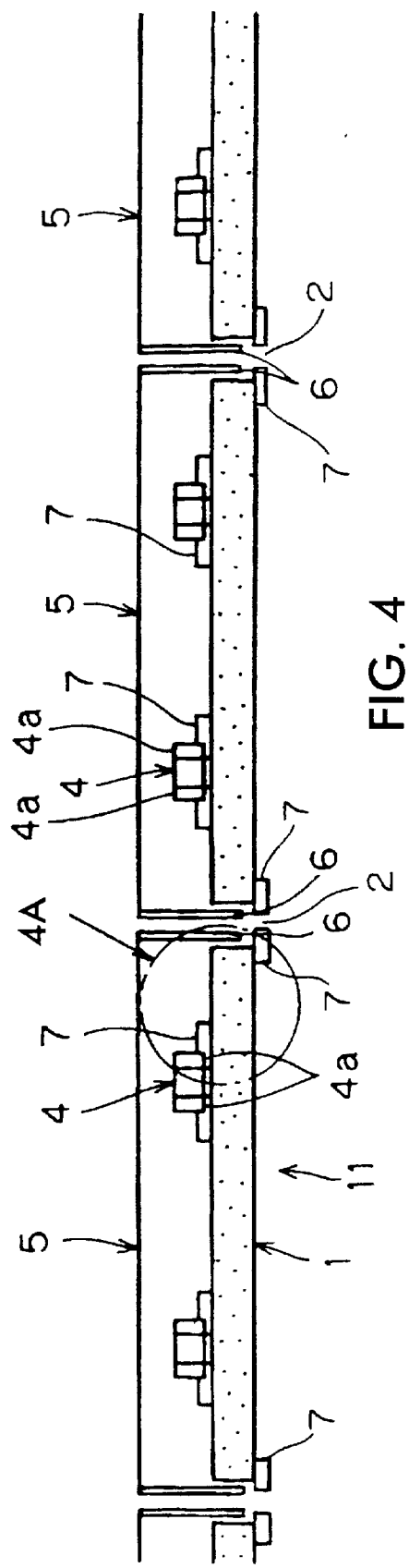
FIG. 4A
FIG. 4

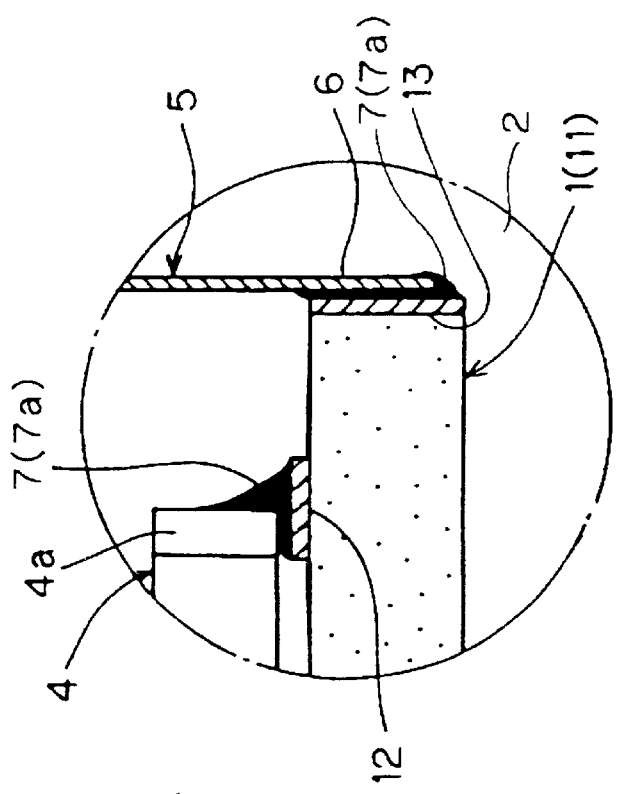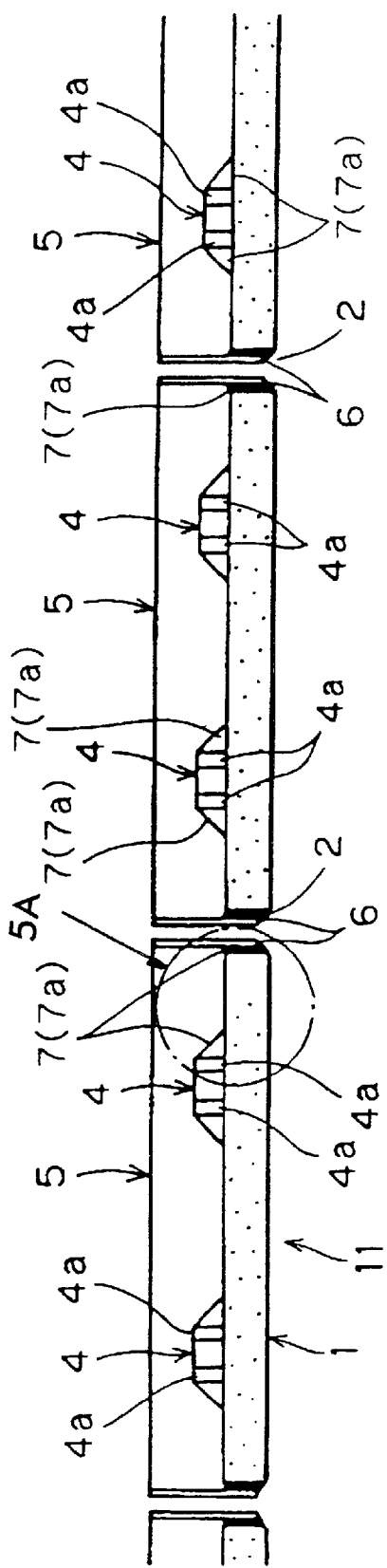
FIG. 5A
FIG. 5

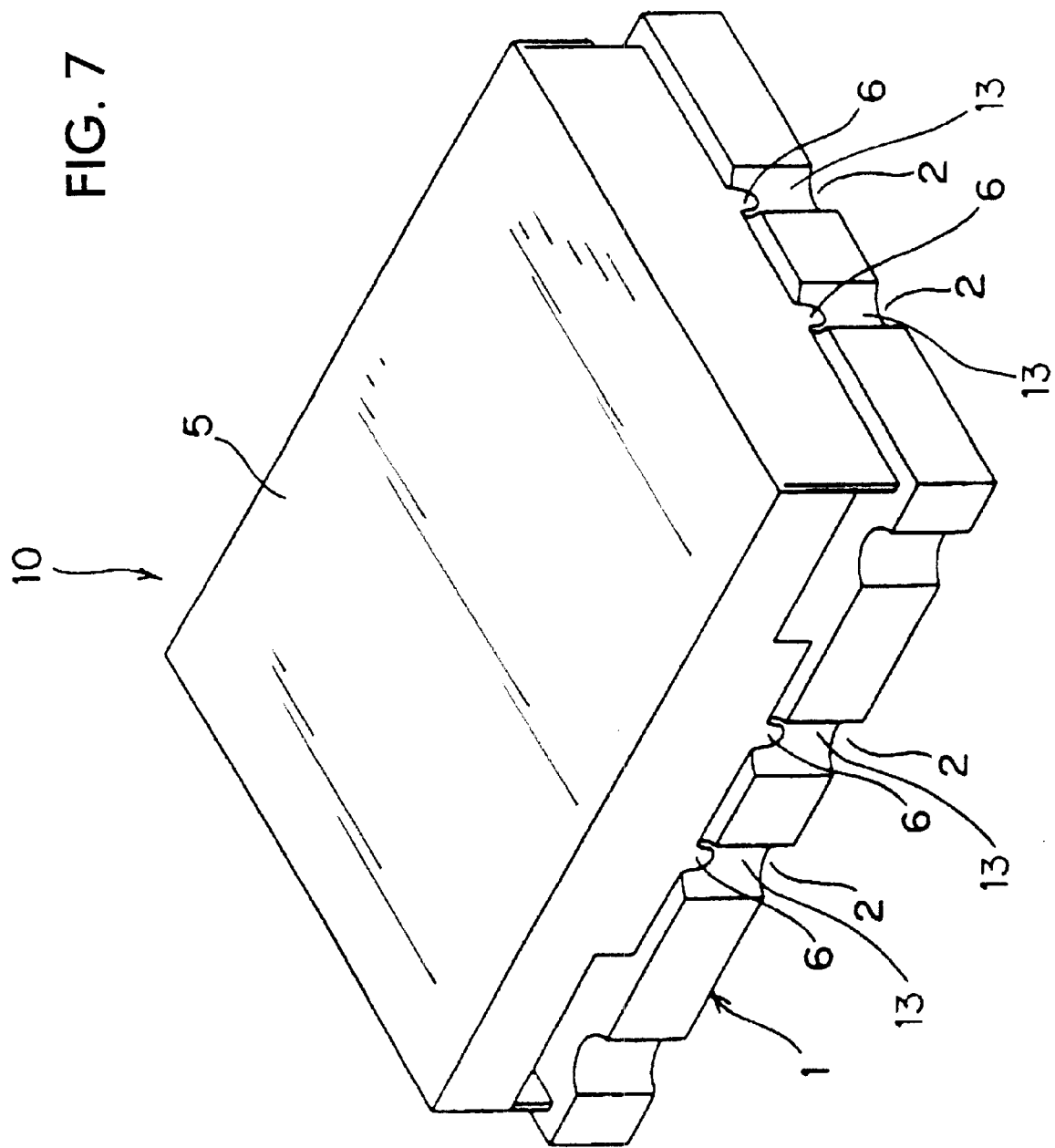

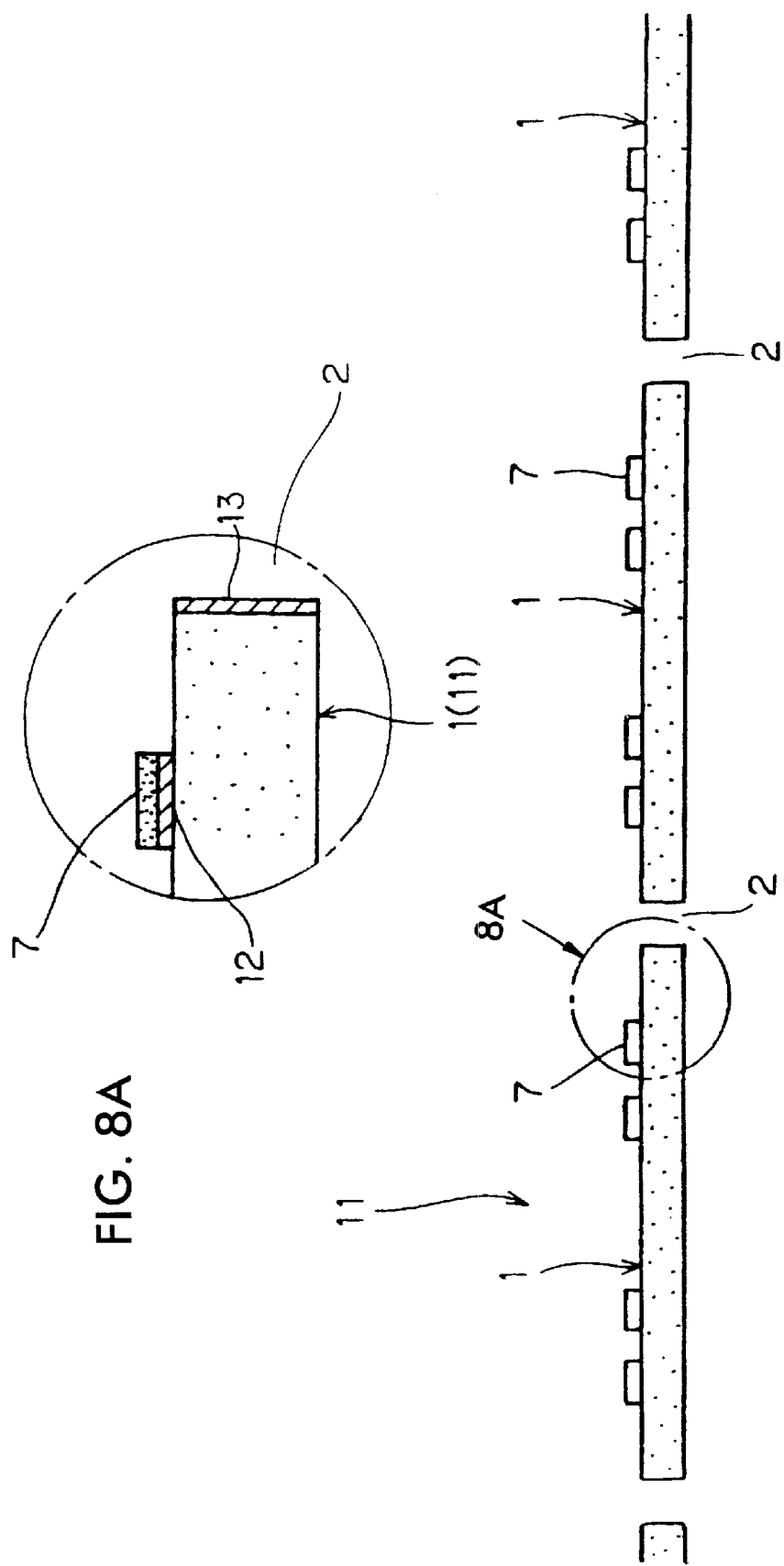

ELECTRONIC COMPONENT WITH SHIELD CASE AND METHOD FOR MANUFACTURING THE SAME

BACKGROUND OF THE INVENTION

1. Field of the Invention

The present invention relates to a method for manufacturing an electronic component. In more detail, the present invention relates to an electronic component with a shield case for housing surface mounting components mounted on a substrate.

2. Description of the Related Art

Electronic components comprises an electronic component 60 with a shield case 65 for housing surface mounting components 64 as shown in FIG. 17. The method for manufacturing the electronic component with such shield case includes the following procedures.

(1) Through-holes 62 are formed on a substrate (a mother substrate) 61 provided with a plurality of substrates 51 for mounting the components, and a shield case attachment electrode 63 is formed on an inner circumference face (side face) of each through hole 62 as shown in FIG. 18.

(2) In the next step, the surface mounting components 64 are mounted on a sheet substrate (the mother substrate) 61, and the surface mounting components 64 are soldered to land electrodes (not shown) of the sheet substrate 61.

(3) Subsequently, a solder paste 67 is filled in the through hole 62.

(4) Then, each engaging pin 66 of a plurality of the shield cases 65 is inserted into the respective through hole 62 filled with the solder paste 67.

(5) Then, a plurality of the shield cases 65 are soldered to the substrate 61 by allowing the solder in the solder paste 67 to melt. The shield cases 65 are connected and fixed to the substrate 61 as shown in FIG. 17 by soldering the engaging pin 66 to the fixing electrodes (shield case attachment electrodes) 63 in the through holes 62.

(6) Finally, an individual electronic component 60 as shown in FIG. 17 is obtained by cutting the sheet substrate 61 along the lines (cutting lines) A—A using a dicing machine.

However, the shield case has been soldered by inserting the engaging pins 66 of the shield case 65 into the through holes 62 after filling the through hole 62 with the solder paste 67. Since the shield case is fixed by almost completely filling the solder in the through holes 62, the solder layer is cut when the mother substrate is cut (diced) into pieces. As a result, it has been a problem that the planarity of the product is compromised due to flashes of the solder, product characteristics are deteriorated by adhesion of solder debris to the product, and cutting becomes insufficient due to loading of the solder on the cutting blade.

In addition, special solder filling equipment is needed for filling the solder paste 67 into the through hole 62, and the amount of the consumed solder paste is increased, raising material cost.

SUMMARY OF THE INVENTION

Accordingly, the object of the present invention for solving the problems as hitherto described is to provide a method for enabling an electronic component with a shield case housing surface mounting components mounted on a substrate to be manufactured by eliminating the step for filling the solder paste into the engaging hole, a highly reliable electronic component with a shield case manufactured by the method described above.

According to the present invention, a method for manufacturing an electronic component with a shield case for housing surface mounting components mounted on a substrate, comprising the steps of: pre-treating for soldering by inserting engaging pins of the shield case into engaging holes of a mother substrate provided with a plurality of the engaging holes, case fixing electrodes for attaching a plurality of the shield cases are disposed on the inner surfaces of the engaging holes, while applying a solder paste on the circumference of the engaging holes, or on an area including the periphery of engaging holes and at least a part of each engaging holes, on an opposite surface to the component mounting surface covered with the shield case on the mother substrate; placing the mother substrate on which the shield case is mounted in a reflow furnace and soldering and fixing each engaging pin of the shield case to the case fixing electrode by reflow soldering; and cutting the mother substrate, on which each engaging pin of the shield case is soldered to respective case fixing electrodes, into respective areas on which each shield case is mounted to divide the mother substrate into individual electronic component with the shield case housing the surface mounting components.

The engaging pin of the shield case is inserted into the engaging hole of the mother substrate, and the engaging pin is soldered to the engaging hole by reflow soldering while the solder paste is coated on the circumference, as well as on the area including the circumference of the engaging hole and at least a part of the engaging hole, at the reverse face (the back face) to the component mounting face covered with the shield case on the mother substrate. Consequently, the molten solder reaches the inside of the engaging hole and permeates into the gap between the engaging pin of the shield case and the case fixing electrode in the engaging hole to connect and fix the engaging pin to the case fixing electrode with the solder. Accordingly, the shield case is securely attached to the substrate (the mother substrate) without requiring the solder paste to be filled in the engaging hole.

Since the solder is not filled in the engaging hole, but a little amount of the solder permeates into the engaging hole, the solder is seldom cut in the cutting step of the mother substrate. Therefore, troubles such as deterioration of flatness of the product due to burrs of the solder caused by cutting the solder, deterioration of characteristics of the product due to adhesion of solder debris to the product, and insufficient cutting due to loading of the solder on the cutting blade can be suppressed and prevented.

The phrase "coating a solder paste on the circumference of the engaging hole, or on the area including the periphery of each engaging hole and at least a part of each engaging hole" as used in the present invention is a concept meaning that the solder paste is coated either only on the circumference of the engaging hole, or the solder paste is coated not only the circumference of the solder paste, but is also coated on the area including (covering) at least a part of the engaging hole in plane view. The method for coating the solder paste is not particularly limited in the present invention, but various method such as screen printing method, or a method for coating in a given pattern using a metal mask can be used.

Preferably, the inner side surface of the engaging pin comes into close contact with the inner circumference face of the engaging hole of the mother substrate when the engaging pin is inserted into the engaging hole on the mother substrate.

The inner side face of the engaging pin comes into close contact with the inner circumference face of the engaging hole of the mother substrate when the engaging pin is inserted into the engaging hole on the mother substrate. Therefore, the molten solder is easily permeate into the gap, because of capillary phenomena, between the inner circumference face of the engaging pin and the case fixing electrode, thereby reliability of attachment of the case is improved.

Preferably, the step for pre-treatment for soldering comprises: (a) coating the solder paste on a connection land electrode to which the surface mounting components mounted on the component mounting surface of the mother substrate is electrically and mechanically connected; (b) coating the solder paste on the circumference of the engaging hole, or on the area including the periphery of the engaging hole and at least a part of the engaging hole, on the opposite surface of the mother substrate; (c) mounting the surface mounting component on the connection land electrode via the solder paste coated on the component mounting surface of the mother substrate; and (d) mounting the shield case on the mother substrate by inserting each engaging pins of the shield case into respective engaging holes, wherein the surface mounting component is soldered to the connection land electrode at the same time when the engaging pin of the shield case is soldered to the case fixing electrode by the reflow soldering in the soldering step.

As described above, the solder paste is coated on the connection land electrode, and is also coated on the circumference of the engaging hole as well as on the area including the circumference of the engaging hole and at least a part of the engaging hole at the back face of the mother substrate, and the engaging pin of the shield case is inserted into the engaging hole after mounting the surface mounting component on the connection land electrode via the solder paste for the pre-treatment for soldering. As a result, the surface mounting component can be soldered on the connection land electrode at the same time when the engaging pin of the shield case is soldered on the case fixing electrode by reflow soldering in the soldering step. Accordingly, only one time of reflow soldering may be sufficient to simplify the manufacturing process, while the number of heating cycle may be reduced to enable deterioration of the surface mounting component to be prevented.

Preferably, the step for pre-treatment for soldering comprises: (a) coating the solder paste on a connection land electrode to which the surface mounting components mounted on the component mounting surface of the mother substrate is electrically and mechanically connected; (b) mounting the surface mounting component on the connection land electrode via the solder paste coated on the component mounting surface of the mother substrate; (c) mounting the shield case on the mother substrate by inserting the engaging pin into the engaging hole; and (d) coating the solder paste on the circumference of the engaging hole, or on the area including the periphery of the engaging hole and at least a part of the engaging hole, on the opposite surface of the mother substrate; wherein the surface mounting component is soldered to the connection land electrode at the same time when the engaging pin of the shield case is soldered to the case fixing electrode by the reflow soldering in the soldering step.

The solder paste is coated on the connection land electrode, is also coated on the circumference of the engaging hole, or on the area including the circumference of the engaging hole and at least a part of the engaging hole, at the back face of the mother substrate after mounting the surface mounting component on the connection land electrode via the solder paste, and the engaging pin is inserted into the engaging hole for the pre-treatment for soldering. As a result, the surface mounting component can be also soldered on the connection land electrode at the same time when the engaging pin of the shield case is soldered on the case fixing electrode by reflow soldering in the soldering step. Accordingly, only one time of reflow soldering may be sufficient to simplify the manufacturing process, while the number of heating cycle may be reduced to enable deterioration of the surface mounting component to be prevented.

Preferably, the step for pre-treatment for soldering comprises: (a) inserting the engaging pin into the engaging hole of the mother substrate on which the surface mounting component is soldered to the connection land electrode of the component mounting surface; and (b) coating the solder paste on the circumference of the engaging hole, or on the area including the periphery of the engaging hole and at least a part of the engaging hole, on the opposite surface of the mother substrate; wherein the engaging pin of the shield case is soldered to the case fixing electrode by reflow soldering in the soldering step.

The engaging pin of the shield case is inserted into the engaging hole of the mother substrate in which the surface mounting component is soldered to the connection land electrode on the component mounting face, and the solder paste is coated on the circumference of the engaging hole as well as on the area including the circumference of the engaging hole and at least on a part of the engaging hole for the pre-treatment for soldering. In this case, the engaging pin of the shield case is soldered to the case fixing electrode in the soldering step.

In other words, it is possible in the present invention to solder the engaging pin of the shield case to the case fixing electrode in a different step from the step for as soldering the surface mounting component to the connection land electrode. The process may be applied when an another step should be inserted between the step of mounting the surface mounting component and the step of soldering engaging pin of the shield case to the case fixing electrode, or when soldering of the surface mounting component to the connection land electrode can not be simultaneously applied with soldering of the engaging pin of the shield case to the case fixing electrode for the convenience of forming the metal mask for printing. In this case, the shield case can be also efficiently and securely attached without requiring the step for filling the paste into the engaging hole.

Preferably, according to the electronic component with a shield case produced by the above manufacturing method, the surface mounting component is soldered to the connection land electrode on the substrate, and the engaging pin of the shield case is soldered to the case fixing electrode disposed on the inner circumference face of the engaging hole of the substrate from the back surface of the substrate.

Since the electronic component with a shield case comprises the structure in which the surface mounting component is soldered to the connection land electrode on the substrate, and the engaging pin of the shield case in which the surface mounting component is housed is soldered to the case fixing electrode disposed on the inner circumference face of the engaging hole of the substrate from the back face side of the substrate, the shield case is securely attached to the substrate with high reliability.

BRIEF DESCRIPTION OF THE DRAWINGS

FIG. 1 shows a step of the method for manufacturing an electronic component with a shield case according to one embodiment (Embodiment 1) of the present invention.

FIG. 2 shows the other step of the method for manufacturing an electronic component with a shield case according to Embodiment 1 of the present invention.

FIG. 4 shows a further different step of the method for manufacturing an electronic component with a shield case according to Embodiment 1 of the present invention.

FIG. 5 shows a further different step o the method for manufacturing an electronic component with a shield case according to Embodiment 1 of the present invention.

FIG. 7 is a perspective view of the electronic component when the mother substrate to which the surface mounting component and the shield case have been soldered is cut and divided into individual electronic component in the method for manufacturing an electronic component with a shield case according to Embodiment 1 of the present invention.

FIG. 8 shows a step of the method for manufacturing an electronic component with a shield case according to the other embodiment (Embodiment 2) of the present invention.

DESCRIPTION OF THE PREFERRED EMBODIMENT

Figure 3A:
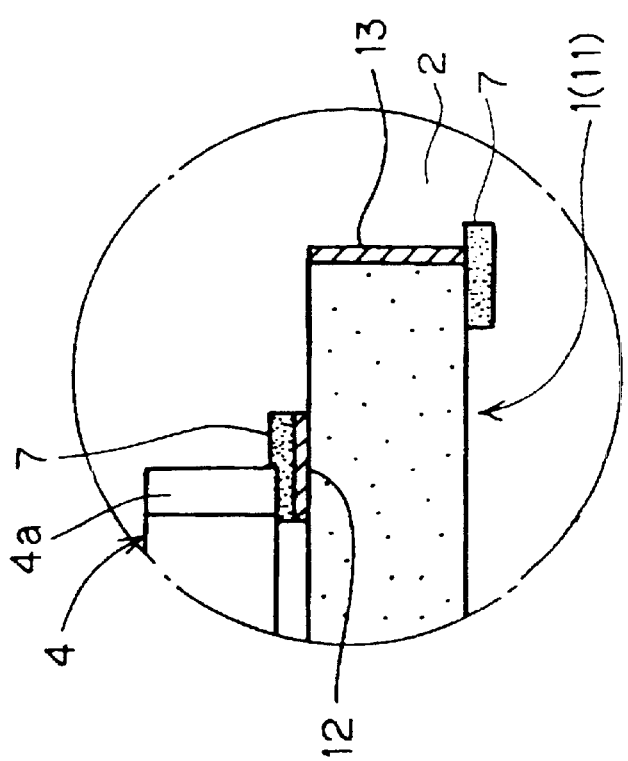
FIG. 3 shows a further different step of the method for manufacturing an electronic component with a shield case according to Embodiment 1 of the present invention.

The features of the present invention will be described in more detail with reference to the embodiments.

Embodiment 1

The method for manufacturing the electronic component (for example, high-frequency electronic components such as a VCO used in a communication equipment) according to the present invention will be described with reference to FIGS. 1 to 7.

(1) As shown in FIGS. 4 and 5, a mother substrate 11 (FIG. 1) mounting surface mounting components 4 and a shield case 5 is prepared. Substrates (printed circuit boards) 1 constituting respective products are integrated into a mother substrate 11, which is divided into a plurality of shield case areas.

A connection land electrode 12, which constitutes a part of a wiring pattern and to which the surface mounting component 4 is electrically and mechanically connected, is formed on one face (the upper face in this embodiment) of the mother substrate 11 (FIG. 1). An engaging hole 2 into which an engaging pin 6 of the shield case 5 is later inserted is formed in the mother substrate 11 as shown in FIGS. 4 and 5. A case fixing electrode 13, to which the engaging pin 6 of the shield case 5 is later soldered, is formed on the inner circumference face of the engaging hole 2.

(2) Then, a solder paste 7 is coated on both the connection land electrode 12 located on the upper surface of the mother substrate 11 and on the circumference of the engaging hole 2 and on the area including a part of the engaging hole 2 (FIG. 2).

The solder paste 7 is disposed so as to cover the periphery of the engaging hole 2 in Embodiment 1.

The solder paste 7 may be coated using a coating apparatus, or may be printed using a screen printing machine, and the coating method is not particularly restricted.

Figure 3:
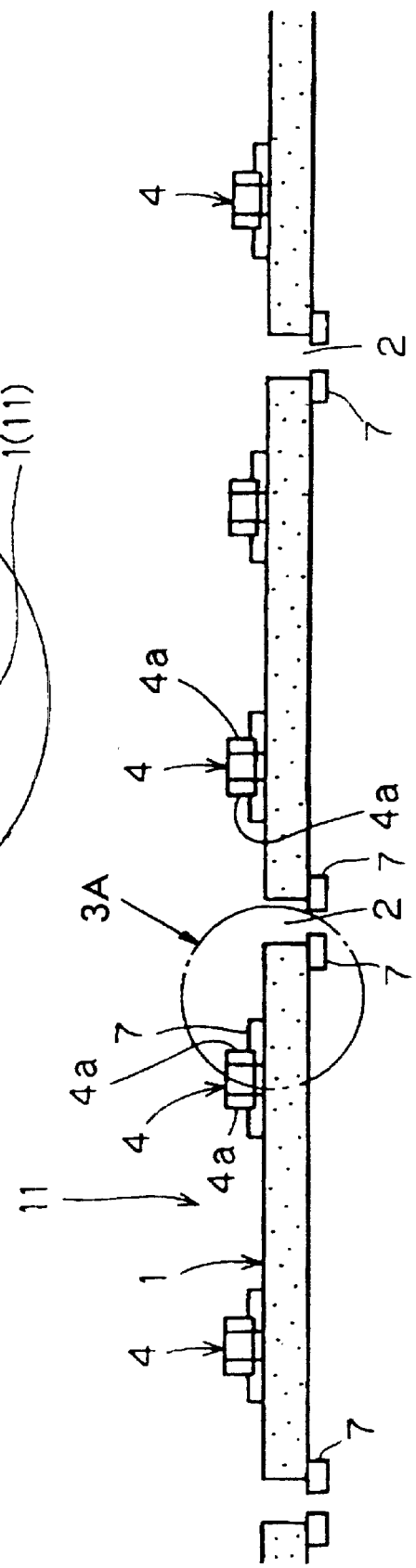

(3) In the next step, as shown in FIG. 3, the surface mounting component 4 is mounted on the connection land electrode 12 on which the solder paste 7 has been coated. The surface mounting component is mounted so that the outer electrode 4a of the surface mounting component 4 comes in good contact with the paste 7 coated on the connection land electrode 12. The surface mounting component 4 is usually mounted using an automatic mounting machine.

(4) Subsequently, a plurality of the shield cases 5 are mounted on the mother substrate 11 so that predetermined surface mounting components 4 may be housed in the case as shown in FIG. 4.

Figure 6:
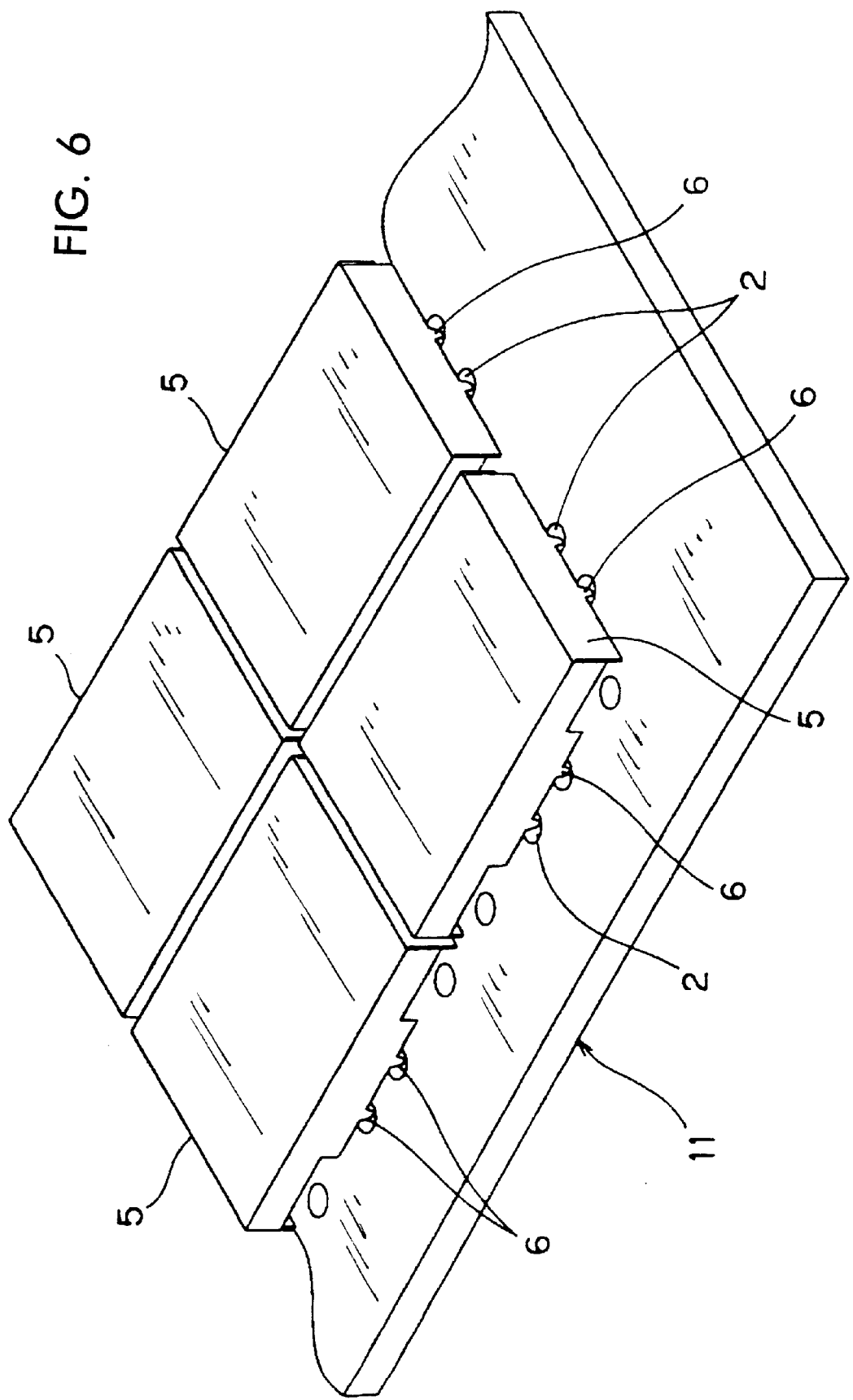
FIG. 6 is a perspective view when a plurality of the shield cases are mounted on the mother substrate in the method for manufacturing an electronic component with a shield case according to Embodiment 1 of the present invention.

A shield case 5, having a structure in which the engaging pins 6 are engaged with the engaging holes 2 of the mother substrate 11, is used in Embodiment 1 as shown in FIGS. 6 and 7. The shield case 5 is also constituted such that inner side face of the engaging pin 6 comes in close contact with the case fixing electrode 13 formed on the inner circumference face of the engaging hole 2 of the mother substrate 11, when the engaging pin 6 of the shield case is inserted into the engaging hole 2 of the mother substrate 11.

The length of the engaging pin 6 is defined so that it does not protrude out of the back face side of the mother substrate 11 through the engaging hole 2 from the surface on which the shield case 5 is mounted.

The shield case 5 is mounted on the mother substrate 11 so that the engaging pin 6 fits into the engaging hole 2 of the mother substrate 11. Although it may be seen that a gap is formed between the inner side face of the engaging pin 6 and the case fixing electrode 13 formed on the inner circumference face of the engaging hole 2 on the mother substrate 11 in FIGS. 4 and 5 to more easily show the connection and fixing state of the engaging pin 6 to the case fixing electrode 13 by means of the solder 7a (FIG. 5), they are actually placed in substantially close contact one another.

(5) Then, the mother substrate 11 on which the surface mounting components 4 and the shield case 5 are mounted are placed in a reflow furnace, and the outer electrodes 4a of the surface mounting components 4 are soldered to the connection land electrodes 12, and the engaging pins 6 of the shield cases 5 are soldered to the case fixing electrode 13 of the mother substrate 11 by reflow soldering (FIG. 5). Since the paste 7 coated on the back face of the mother substrate 11 is melted in the reflow furnace to permeate into the gap between the engaging pin 6 and the case fixing electrode 13, the engaging pin 6 is securely joined and fixed to the case fixing electrode 13 using a small quantity of the solder 7a.

FIG. 6 shows a plurality of the shield cases 5 mounted on the mother substrate 11.

(6) Then, the mother substrate on which a plurality of the surface mounting components and shield cases are mounted and soldered is cut and divided for each area corresponding to each shield case, thereby to obtain individual electronic components 10 with a shield case 5 in which the surface mounting components (not shown) are accommodated as shown in FIG. 7. The solder is omitted in FIG. 7 for easy recognition.

According to the method as described above, the solder paste 7 is applied on the connection land electrode 12 and both on the circumference of the engaging hole 2 and on the area including the a part of the engaging hole 2, and after mounting the surface mounting components 4 and the shield case 5, the mother substrate is placed in the reflow furnace to solder the surface mounting components 4 to the connection land electrode 12 and the engaging pin 6 of the shield case 5 to the case fixing electrode 13. Accordingly, both of the surface mounting components 4 and the shield case 5 can be simultaneously attached to the mother substrate 11, thereby enabling the electronic component to be efficiently manufactured.

Since the surface mounting components 4 is placed in the reflow furnace only one time, change of characteristics of the surface mounting components 4 by the heat of the reflow furnace can be suppressed and prevented, also enabling the electronic component to be stably obtained.

The solder 7a (FIG. 5) is not filled in the engaging hole 2, but a small quantity of the solder flows into the engaging hole 2. Consequently, the solder 7a (FIG. 5) is seldom cut in the step for cutting the mother substrate 11, thereby troubles such as deterioration of flatness of the product due to burrs of the solder caused by cutting the solder, deterioration of characteristics of the product due to adhesion of solder debris to the product, and insufficient cutting due to loading of the solder on the cutting blade can be suppressed and prevented.

Since the paste 7 is applied (supplied) on the mother substrate 11 before it is divided into a plurality of the electronic components, accuracy of the paste feed position and the amount of supplied paste 7 can be improved to enable the electronic component to be efficiently manufactured without being restricted to the size of the individual products. Consequently, the manufacturing facilities can be made to be small size and the work space can be saved.

Embodiment 2

FIGS. 8 to 12 show the method for manufacturing the electronic component with a shield case according to the other preferred embodiment of the present invention.

The method for manufacturing the electronic component with a shield case according to Embodiment 2 will be described with reference to FIGS. 8 to 12.

(1) A solder paste 7 is coated on the connection land electrode 12 of the same mother substrate 11 as used in Embodiment 1 (FIG. 8).

Figure 9A:
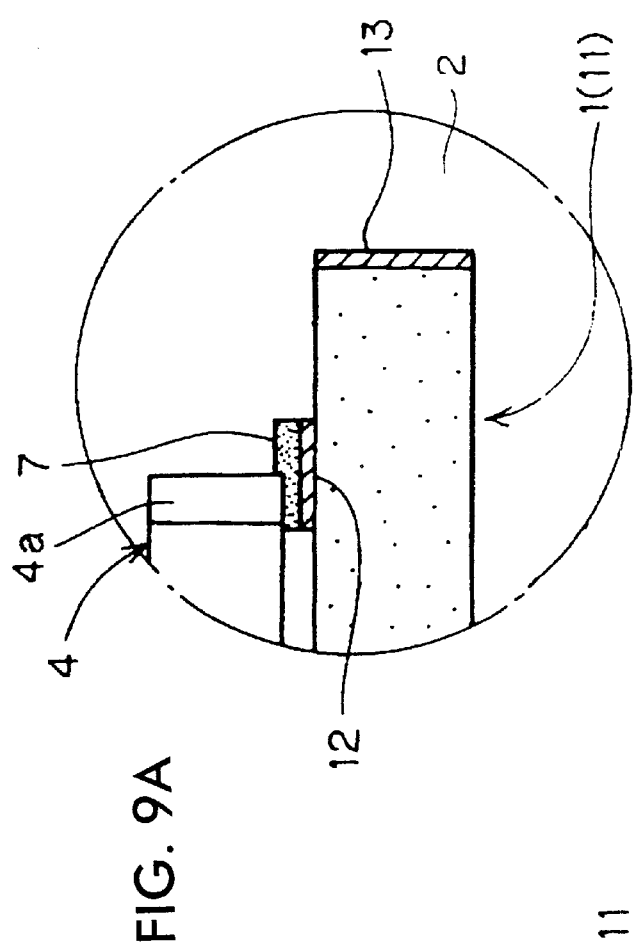
FIG. 9 shows the other step of the method for manufacturing an electronic component with a shield case according to Embodiment 2 of the present invention.
Figure 9:
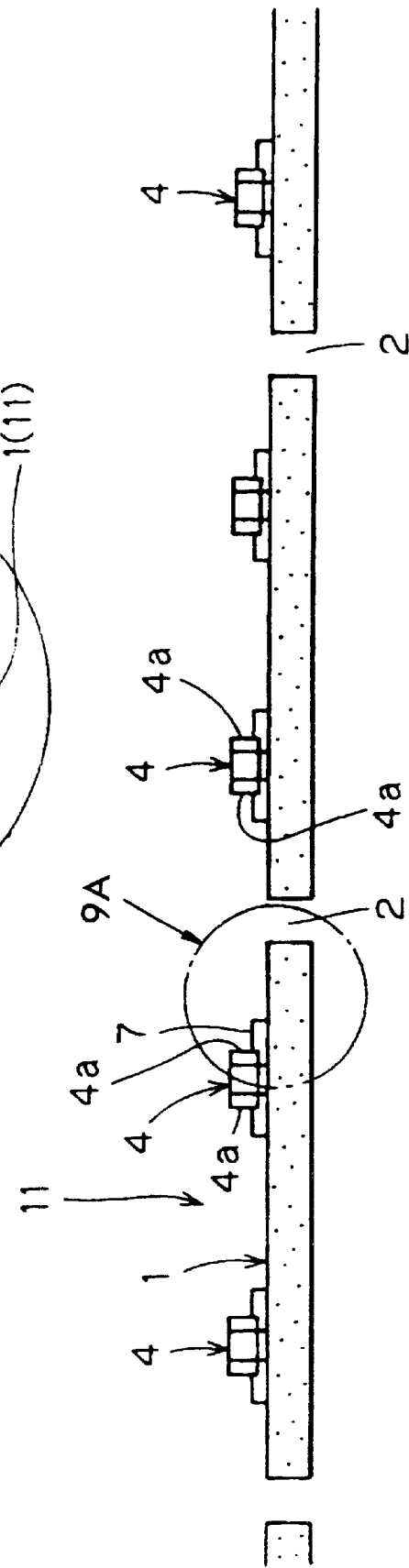

(2) Then, as shown in FIG. 9, the surface mounting components 4 are mounted on the connection land electrode 12 on which the solder paste 7 has been coated.

Figure 10A:
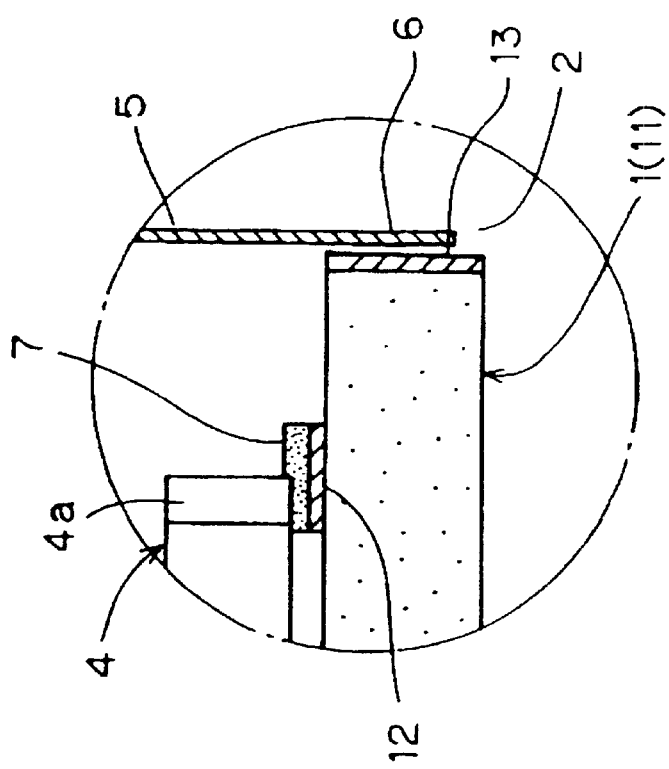
FIG. 10 shows a further different step of the method for manufacturing an electronic component with a shield case according to Embodiment 2 of the present invention.
Figure 10:
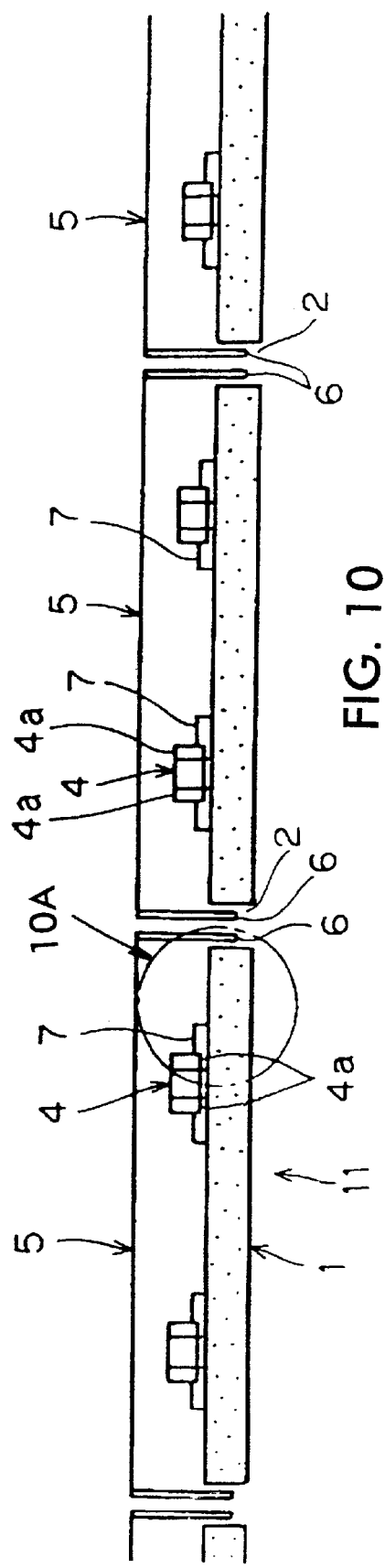

(3) Subsequently, as shown in FIG. 10, a plurality of the shield cases 5 are mounted on the mother substrate 11 to store the surface mounting components 4.

The same shield case 5 as used in Embodiment 1 is used in this embodiment.

Figure 11A:
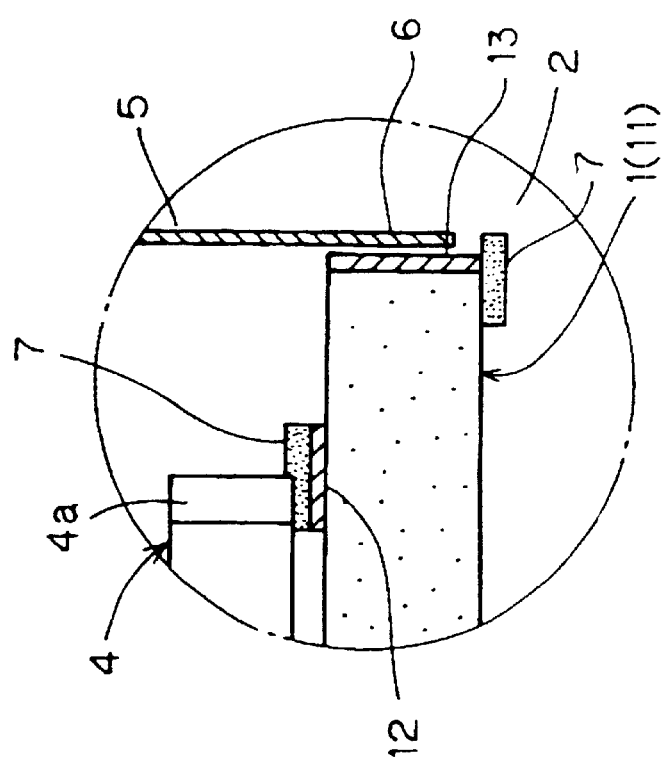
FIG. 11 shows a further different step of the method for manufacturing an electronic component with a shield case according to Embodiment 2 of the present invention.
Figure 11:
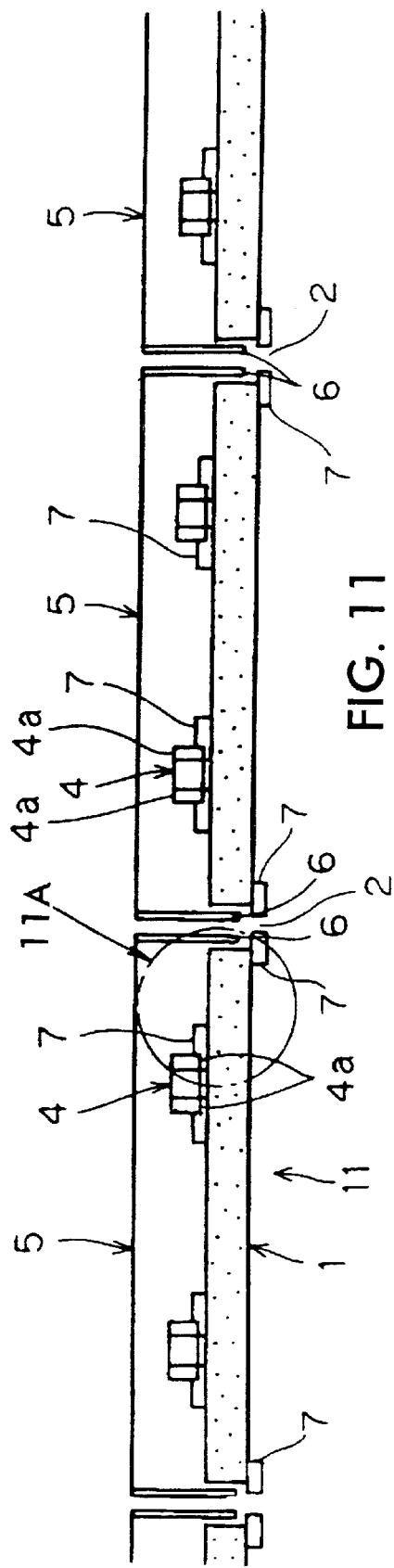

(4) Then, the solder paste 7 is applied on the circumference of the engaging hole 2 and on the area including a part of the engaging hole 2 at the back face of the mother substrate 11 as shown in FIG. 11.

Figure 12A:
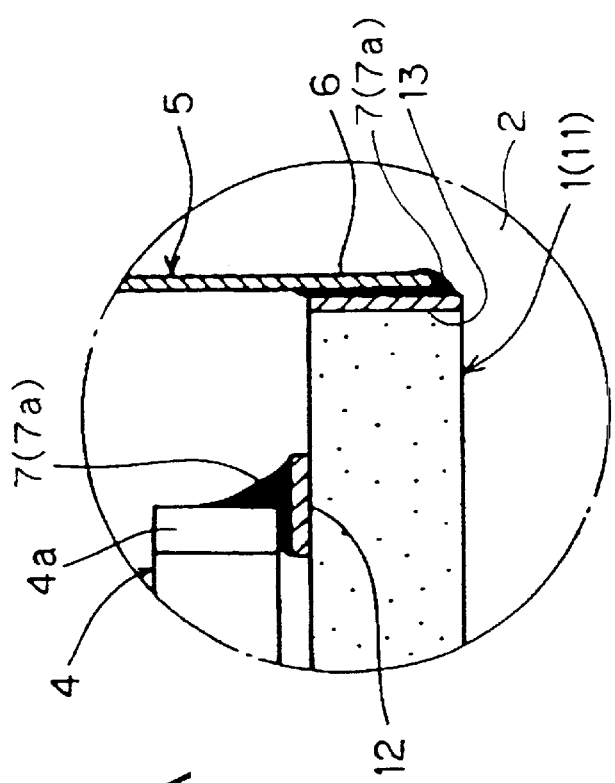
FIG. 12 shows a further different step of the method for manufacturing an electronic component with a shield case according to Embodiment 2 of the present invention.
Figure 12:
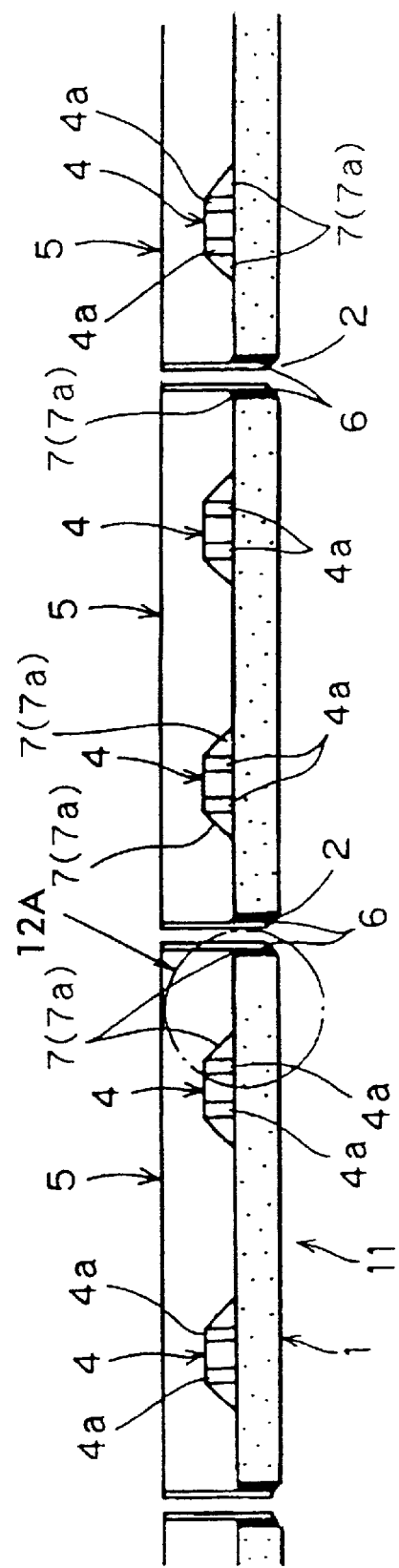

(5) Then, the mother substrate 11 on which the surface mounting components 4 and the shield case 5 are mounted is placed in a reflow furnace. After melting the paste 7 (the solder 7a in the solder paste; see FIG. 7) followed by cooling, the outer electrode 4a of the surface mounting component 4 is soldered to the connection land electrode 12, and the engaging pin 6 of the shield case 5 is soldered to the case fixing electrode 13 of the mother substrate 11 (FIG. 12). Since the solder paste 7 coated on the back face of the mother substrate 11 is allowed to melt in the reflow furnace and permeates into the gap between the engaging pin 6 and the case fixing electrode 13, the engaging pin 6 is securely joined and fixed to the case fixing electrode 13 using a small quantity of the solder 7a.

(6) Individual electronic component 10 with a shield case 5 housing the surface mounting components (not shown) as shown in FIG. 7 is obtained by cutting and dividing the soldered mother substrate on which a plurality of the surface mounting components and shield cases are mounted into each area where each shield case is mounted.

Although the engaging pin 6 of the shield case 5 is preferably soldered to the case fixing electrode 13 of the mother substrate 11 at the same time that the outer electrode 4a of the surface mounting component 4 is soldered to the connection land electrode 12 in Embodiment 2, it is possible to solder the surface mounting component 4 to the connection land electrode 12 by applying reflow soldering when the surface mounting component 4 is mounted. However, it is advantageous to solder the engaging pin 6 of the shield case 5 to the case fixing electrode 13 of the mother substrate 11 at the same time when the outer electrode 4a of the surface mounting component 4 is soldered to the connection land electrode 12 in Embodiment 2, since only one time of soldering is required.

Embodiment 3

FIGS. 13 to 16 shows the method for manufacturing the electronic component with a shield case according to a further different embodiment of the present invention. In Embodiment 3, the electronic component with a shield case is manufactured by mounting a shield case on a mother board on which the surface mounting components have been already mounted and soldered, followed by cutting and dividing the mother substrate.

Figure 13A:
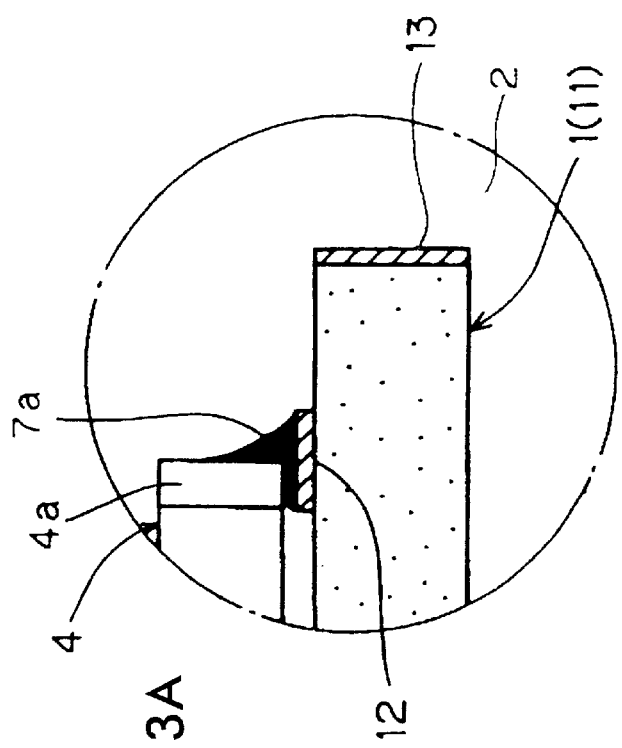
FIG. 13 shows a step of the method for manufacturing an A electronic component with a shield case according to a further different embodiment (Embodiment 3) of the present invention.
Figure 13:
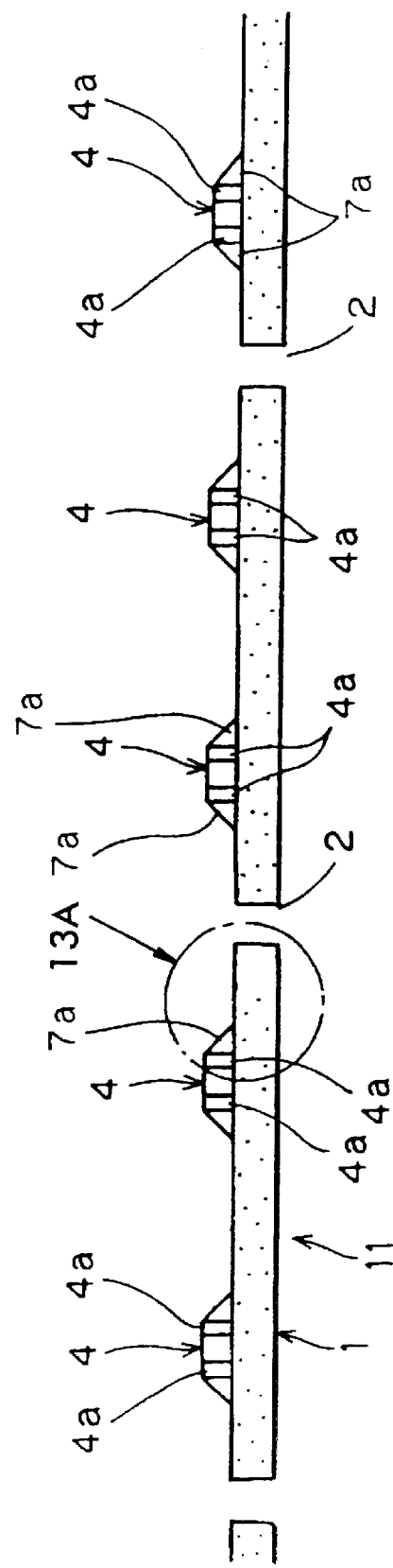
Figure 14A:
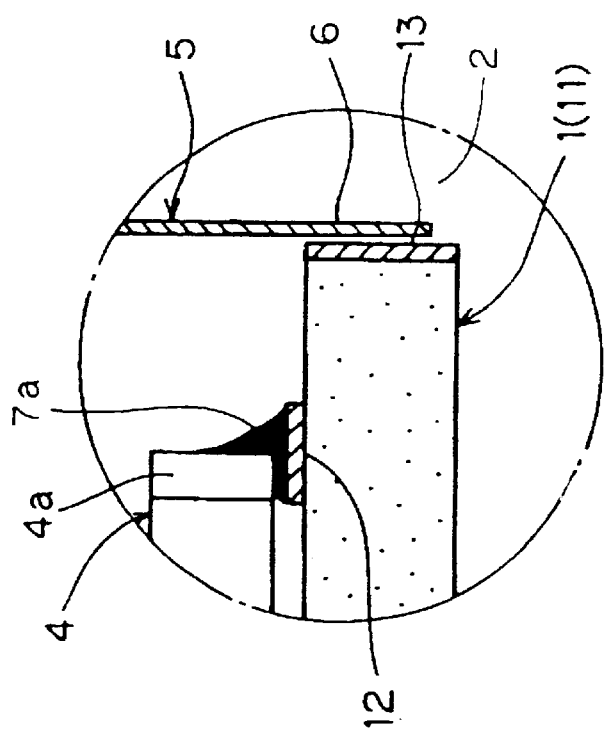
FIG. 14 shows an another step of the method for manufacturing an electronic component with a shield case according to Embodiment 3 of the present invention.
Figure 14:
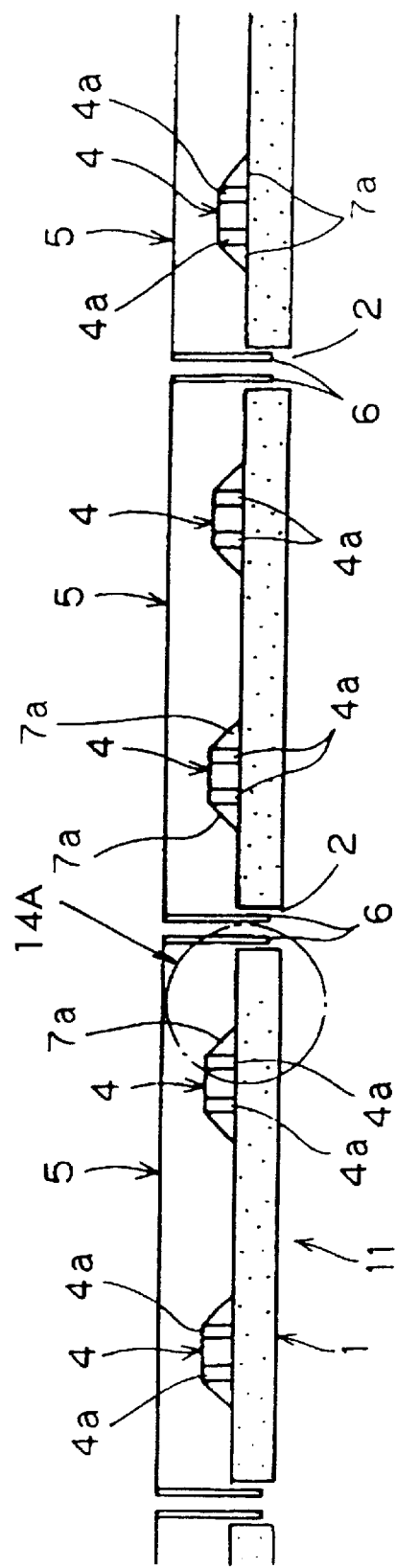

(1) A plurality of the shield cases 5 are mounted as shown in FIG. 14 on the mother substrate 11 on which the surface mounting components 4 have been mounted and are connected and fixed to the connection land electrode 12 with the solder 7a as shown in FIG. 13, and the engaging pin 6 is inserted into the engaging hole 2 of the mother substrate The same shield case 5 as used in Embodiment 1 is also used in this embodiment.

Figure 15A:
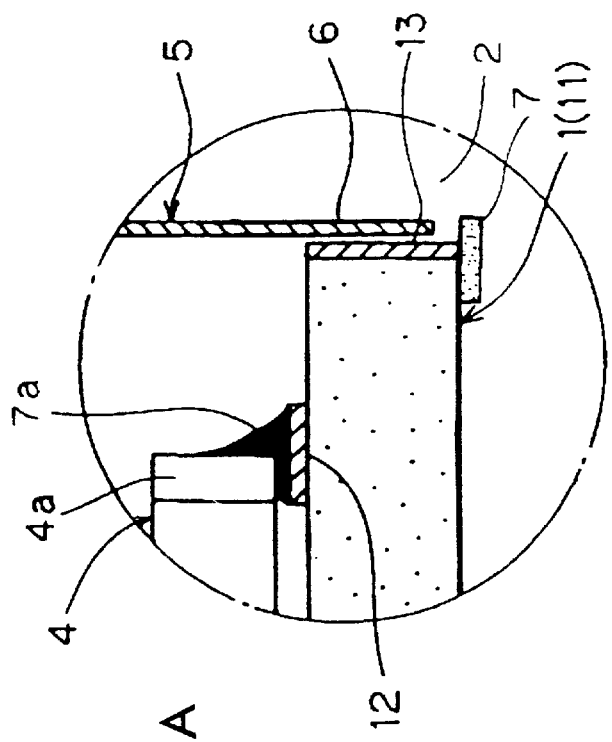
FIG. 15 shows a further different step of the method for manufacturing an electronic component with a shield case according to Embodiment 3 of the present invention.
Figure 15:
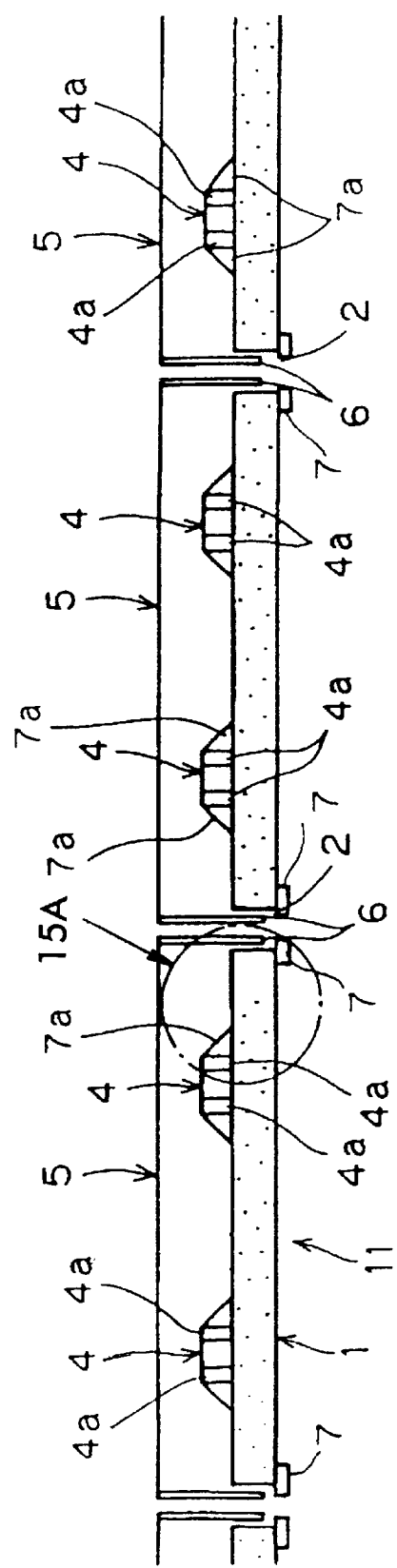

(2) Then, the solder paste 7 is applied on the circumference of the engaging hole 2 as well as on the area including a part of the engaging hole 2 as shown in FIG. 15.

Figure 16A:
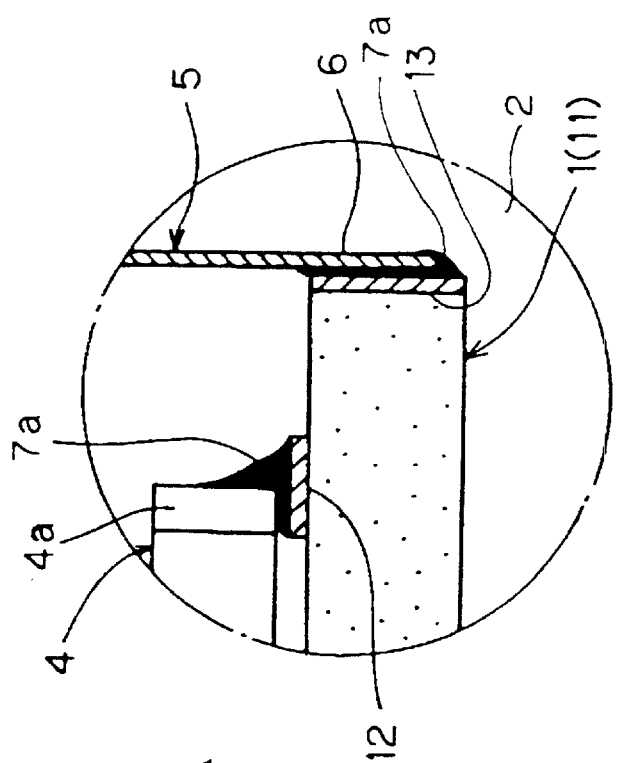
FIG. 16 shows a further different step of the method for manufacturing an electronic component with a shield case according to Embodiment 3 of the present invention.
Figure 16:
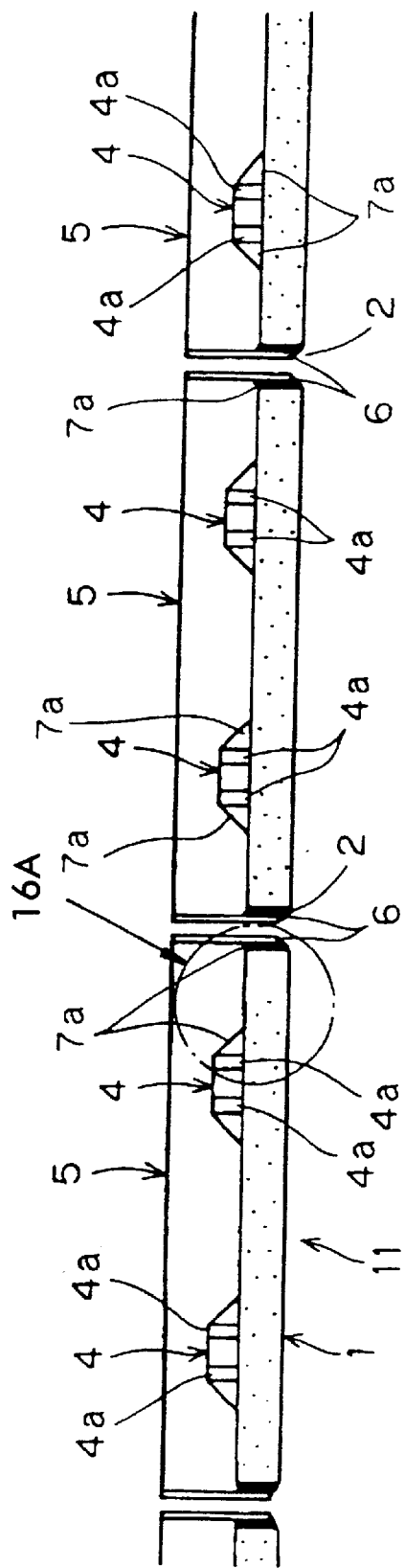
Figure 17:
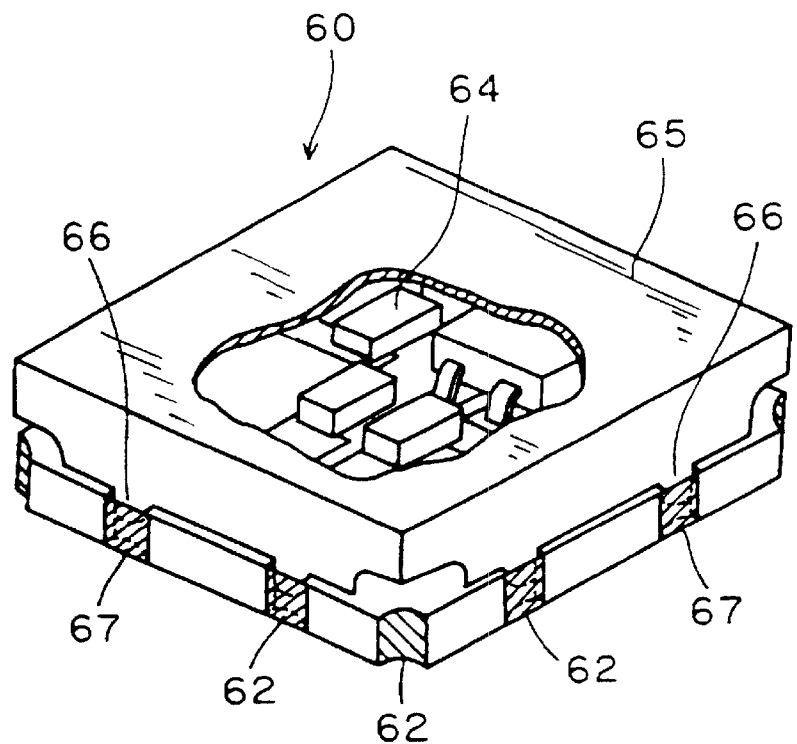
FIG. 17 is a perspective view showing a conventional electronic component with a shield case.
Figure 18:
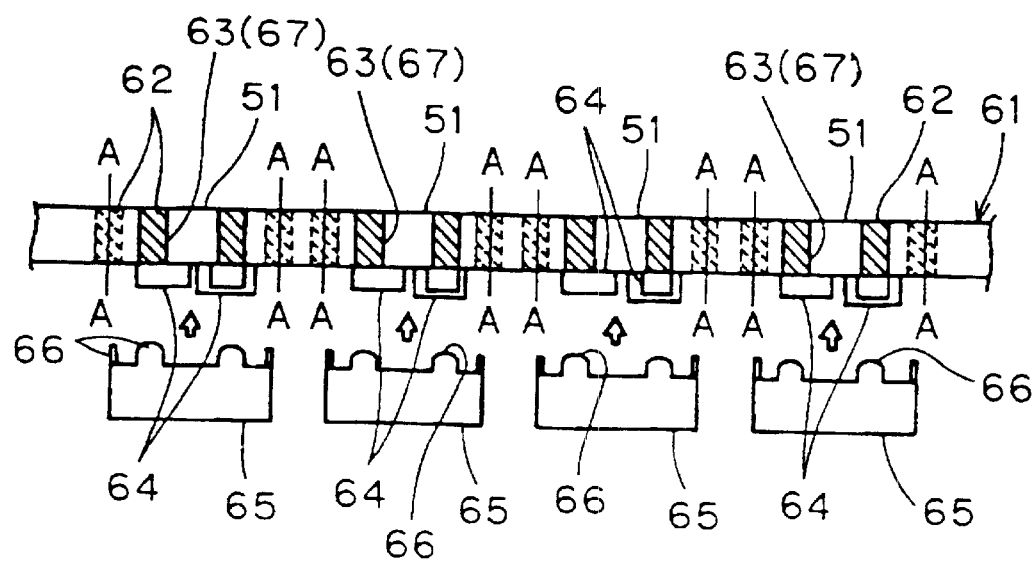
FIG. 18 shows a method for manufacturing a conventional electronic component with a shield case.

(3) Subsequently, the engaging pin 6 of the shield case 5 is soldered to the case fixing electrode 13 of the mother substrate 11 as shown in FIG. 16, by placing the mother substrate 11 mounting the shield case 5 into a reflow furnace to melt the solder paste 7. Since the solder paste 7 coated on the back face of the mother substrate 11 melts in the reflow furnace to permeate into the gap between the engaging pin 6 and the case fixing electrode 13, the engaging pin 6 is securely joined and fixed to the case fixing electrode 13 using a small quantity of the solder 7*a*.

(4) Individual electronic component 10 with a shield case 5 housing the surface mounting components (not shown) is obtained as shown in FIG. 7 by cutting and dividing the mother substrate, on which a plurality of the surface mounting components and shield cases are mounted and soldered, into each area corresponding to respective shield cases.

It is possible to apply the present invention to the case as described in Embodiment 3 in which the shield case 5 is mounted on the mother substrate 11 on which the surface mounting component 4 has been already soldered to the connection land electrode 12, and the mother substrate 11 is cut after soldering to divide into individual electronic component with a shield case. The present invention can be also applied when an another step should be inserted between the step for packaging the surface mounting component and the step for soldering the shield case to the case fixing electrode, or when soldering of the surface mounting component to the connection land electrode cannot be simultaneously applied with the step for soldering the engaging pin of the shield case to the case fixing electrode for the reason of forming a metal mask for printing. However, the method described above is also significant since the solder paste is not required to be filled in the engaging hole to allow the shield case to be efficiently and securely attached.

While the examples for manufacturing the high frequency electronic components such as VCO to be used in the communication equipment have been described in Embodiments 1 to 3, it is also possible to apply the present invention for manufacturing the other kinds of the electronic components.

The present invention is by no means restricted to the embodiments as set forth above, but various applications and modifications are possible within the range of the spirit of the present invention with respect to shapes of the substrate, patterns of the connection land electrode and case fixing electrode, and actual shapes and structures of the shield case and its engaging pin.

As hitherto described, the present invention provides a method for manufacturing an electronic component with a shield case comprising the steps of: inserting the engaging pin of the shield case into the engaging hole of the mother substrate; and applying reflow soldering by coating the solder paste on the circumference of the engaging hole as well as on the area including the circumference of the engaging hole and at least a part of the engaging hole at the reversed face (back face) of the component mounting face of the mother substrate covered with the shield case. Consequently, the molten solder reaches the inside of the engaging hole to permeate into the gap between the engaging pin of the shield case and the case fixing electrode in the engaging hole to connect and fix the engaging pin to the case fixing electrode. Therefore, the solder paste is not required to be filled in the engaging hole to enable the shield case to be securely attached to the substrate (mother substrate).

Since the solder is not filled in the engaging hole but a small quantity of the solder flows into the engaging hole, the solder is seldom cut in the step for cutting the mother substrate, thereby troubles ascribed to cutting the solder such as compromised planarity of the product due to flashes of the solder caused by cutting the solder, deterioration of characteristics of the product due to adhesion of solder debris to the product, and insufficient cutting due to loading of the solder on the cutting blade can be suppressed and prevented.

When the shield case is constructed so that the inner side face of the engaging pin approximately comes into close contact with the inner circumference face of the engaging hole of the mother substrate when the engaging pin is inserted into the engaging hole on the mother substrate, the molten solder readily permeate into the gap between the inner circumference face of the engaging pin and the case fixing electrode by a capillary action to enable reliability of attachment of the shield case to be improved.

When the step for pre-treatment for soldering comprises coating the solder paste on the circumference of the engaging hole, as well as on the area including the circumference of the engaging hole and at least a part of the engaging hole, of the back face of the mother substrate, followed by inserting the engaging pin of the shield case into the engaging hole after mounting the surface mounting component on the component mounting face, the surface mounting component can be soldered to the connection land electrode at the same time when the engaging pin of the shield case is soldered to a case fixing electrode by applying a reflow soldering in the soldering step. Accordingly, one step of reflow soldering is made possible to enable the manufacturing process to be simplified besides reducing the number of the heating steps to prevent deterioration of the surface mounting component.

When the step for pre-treatment for soldering comprises coating the solder paste on a connection land electrode, and coating the solder paste on the circumference of the engaging hole, as well as on the area including the circumference of the engaging hole and at least a part of the engaging hole, of the back face of the mother substrate after mounting the surface mounting component on the component mounting face, followed by inserting the engaging pin of the shield case into the engaging hole, the surface mounting component can be soldered to the connection land electrode at the same time when the engaging pin of the shield case is soldered to a case fixing electrode by applying a reflow soldering in the soldering step. Accordingly, one step of reflow soldering is made possible to enable the manufacturing process to be simplified besides reducing the number of the heating steps to prevent deterioration of the surface mounting component.

When the step for pre-treatment for soldering comprises inserting the engaging pin into the engaging hole of the mother substrate in which the surface mounting component is soldered to the connection land electrode of the component mounting face; and coating the solder paste on the circumference of the engaging hole, or on the area including the circumference of the engaging hole and at least a part of the engaging hole, of the back face of the mother substrate, the molten solder reaches the inside of the engaging hole to permeate into the gap between the engaging pin of the shield case and the case fixing electrode in the engaging hole in the soldering step, enabling the engaging pin to be securely connected and fixed to the case fixing electrode by soldering.

In other words, the present invention can be applied when an another step should be inserted between the step for packaging the surface mounting component and the step for soldering the shield case to the case fixing electrode, or when soldering of the surface mounting component to the connection land electrode cannot be simultaneously applied with the step for soldering the engaging pin of the shield case to the case fixing electrode for the reason of forming a metal mask for printing. The method as described above is significant since the solder paste is not required to be filled in the engaging hole to enable the shield case to be efficiently and securely attached.

Since the electronic component with a shield case manufactured by the method according to the present invention comprises the structure in which the surface mounting component is soldered to the connection land electrode on the substrate, and the engaging pin of the shield case in which the surface mounting component is housed is soldered to the case fixing electrode disposed on the inner circumference face of the engaging hole of the substrate from the back face side of the substrate, the shield case can be securely attached to the substrate with a high reliability.

What is claimed is:

1. A method for manufacturing an electronic component, the method comprising:
    placing an intermediate component in a reflow furnace, the intermediate component including a mother substrate and a shield case covering at least one surface mounted component located on a front surface of the mother substrate, the shield case having engaging pins which extend into respective engaging holes of the mother substrate, each of the engaging holes having a respective case fixing electrode disposed on the inner surface thereof such that each engaging pin is associated with a respective case fixing electrode, the intermediate component also including solder paste located on a rear surface of the mother substrate in the area of the circumference of the engaging holes, or on an area including the periphery of the engaging holes and at least a part of each engaging hole;
    soldering each engaging pin to its associated case fixing electrode by reflow soldering while the intermediate component is in the reflow furnace; and
    cutting the mother substrate in the area of the periphery of the shield case to form the electronic component.

2. A method for manufacturing an electronic component according to claim 1 further comprising forming the intermediate component according to a process, comprising:
    (1) coating solder paste on connection land electrodes to which the at least one surface mounting components are to be electrically and mechanically connected;
    (2) coating solder paste on the rear surface of the mother substrate in the area of the circumference of the engaging holes, or in the area including the periphery of the engaging holes and at least a part of the engaging holes;
    (3) mounting the at least one surface mounting components on the connection land electrodes via the solder paste coated thereon; and
    (4) mounting the shield case on the mother substrate by inserting the engaging pins into their respective engaging holes; and
    wherein the at least one surface mounting component is soldered to the connection land electrodes at the same time that the engaging pins of the shield cases are soldered to the case fixing electrodes by reflow soldering.

3. A method for manufacturing an electronic component according to claim 1, further comprising forming the intermediate component according to a process comprising:
    (1) coating solder paste on the connection land electrodes to which the surface mounting components are to be electrically and mechanically connected;
    (2) mounting the surface mounting components on the connection land electrodes via the solder paste coated thereon;
    (3) mounting the shield case on the mother substrate by inserting the engaging pins into their respective engaging holes; and
    (4) coating solder paste on the rear surface of the mother substrate in the area of the circumference of the engaging holes, or in the area including the periphery of the engaging holes and at least a part of the engaging holes; and
    wherein the surface mounting components are soldered to the connection land electrodes at the same time that the engaging pins of the shield cases are soldered to the case fixing electrodes by reflow soldering.

4. A method for manufacturing an electronic component according to claim 1, further comprising forming the intermediate component according to a process comprising:
    (1) inserting the engaging pins into the respective engaging holes of the mother substrate on which the at least one surface mounting component has been soldered to at least one corresponding connection land electrode located on the front surface of the mother substrate; and
    (2) coating solder paste on the rear surface of the mother substrate in the area of the circumference of the engaging holes, or in the area including the periphery of the engaging holes and at least a part of the engaging holes.

5. A method for manufacturing an electronic component according to claim 1 wherein the engaging pins do not extend beyond the rear surface of the mother substrate.

6. An electronic component manufactured by the method of claim 2.

7. An electronic component manufactured by the method of claim 3.

8. An electronic component manufactured according to the method of claim 4.

9. A method for manufacturing an electronic component according to claim 1, wherein said solder paste permeates into said engaging holes in said reflow soldering step.

10. A method for manufacturing an electronic component according to claim 9, wherein the solder paste further permeates into a gap between each said engaging pin and the associated engaging electrode.

11. A method for manufacturing an electronic component, the method comprising:
    placing an intermediate component in a reflow furnace, the intermediate component including a mother substrate and a shield case covering at least one surface mounted component located on a front surface of the mother substrate, the shield case having engaging pins which extend into respective engaging holes of the mother substrate, each of the engaging holes having a respective case fixing electrode disposed on the inner surface thereof such that each engaging pin is associated with a respective case fixing electrode, solder paste located on a rear surface of the mother substrate in the area of the circumference of the engaging holes, or on an area including the periphery of the engaging holes and at least a part of each engaging hole, the inner side surface of each of the engaging pins coming into close contact with the inner circumferential face of its associated engaging hole;

soldering each engaging pin to its associated case fixing electrode by reflow soldering; and cutting the mother substrate in the area of the periphery of the shield case to form the electronic component.

12. A method for manufacturing an electronic component according to claim 11, further comprising forming the intermediate component according to a process comprising:

(1) coating solder paste on connection land electrodes to which the at least one surface mounting components are to be electrically and mechanically connected;

(2) coating solder paste on the rear surface of the mother substrate in the area of the circumference of the engaging holes, or in the area including the periphery of the engaging holes and at least a part of the engaging holes;

(3) mounting the at least one surface mounting components on the connection land electrodes via the solder paste coated thereon; and (4) mounting the shield case on the mother substrate by inserting the engaging pins into their respective engaging holes; and wherein the at least one surface mounting component is soldered to the connection land electrodes at the same time that the engaging pins of the shield cases are soldered to the case fixing electrodes by the reflow soldering.

13. A method for manufacturing an electronic component according to claim 11, further comprising forming the intermediate component according to a process comprising:

(1) coating solder paste on the connection land electrodes to which the surface mounting components are to be electrically and mechanically connected;

(2) mounting the surface mounting components on the connection land electrodes via the solder paste coated thereon;

(3) mounting the shield case on the mother substrate by inserting the engaging pins into their respective engaging holes; and (4) coating solder paste on the rear surface of the mother substrate in the area of the circumference of the engaging holes, or in the area including the periphery of the engaging holes and at least a part of the engaging holes; and wherein the surface mounting components are soldered to the connection land electrodes at the same time that the engaging pins of the shield cases are soldered to the case fixing electrodes by reflow soldering.

14. A method for manufacturing an electronic component according to claim 11 further comprising forming the intermediate component according to a process comprising:

(1) inserting the engaging pins into the respective engaging holes of the mother substrate on which the at least one surface mounting component has been soldered to at least one corresponding connection land electrode located on the front surface of the mother substrate; and (2) coating solder paste on the rear surface of the mother substrate in the area of the circumference of the engaging holes, or in the area including the periphery of the engaging holes and at least a part of the engaging holes.

15. A method for manufacturing an electronic component according to claim 11 wherein the engaging pins do not extend beyond the rear surface of the mother substrate.

16. An electronic component manufactured by the method of claim 12.

17. An electronic component manufactured by the method of claim 13.

18. An electronic component manufactured according to the method of claim 14.

19. A method for manufacturing an electronic component according to claim 11, wherein said solder paste permeates into said engaging holes in said reflow soldering step.

20. A method for manufacturing an electronic component according to claim 19, wherein the solder paste further permeates into a gap between each said engaging pin and the associated engaging electrode.

* * * * *